(12) United States Patent
Tomita et al.

(10) Patent No.: US 6,389,896 B1
(45) Date of Patent: *May 21, 2002

(54) VEHICULAR METER UNIT

(75) Inventors: Kiyoshi Tomita, Saitama; Masahiko Suzuki, Ibaraki; Kinya Tamura, Saitama, all of (JP)

(73) Assignee: Calsonic Kansei Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,570

(22) Filed: Jun. 4, 1999

(30) Foreign Application Priority Data

Jun. 5, 1998 (JP) ............................................ 10-157030

(51) Int. Cl.$^7$ ................................................. G01P 1/02
(52) U.S. Cl. ...................... 73/493; 116/62.1; 116/62.4; 340/441
(58) Field of Search .................. 73/488, 493; 116/62.1, 116/62.2, 62.3, 62.4; 324/160, 163; 340/441, 936, 466

(56) References Cited

U.S. PATENT DOCUMENTS 2,142,248 A * 1/1939 Le Fevre et al.
6,094,984 A * 8/2000 Asano et al. .................. 73/493

* cited by examiner

Primary Examiner—Eric S. McCall
(74) Attorney, Agent, or Firm—Foley & Lardner

(57) ABSTRACT

A vehicular meter unit includes an analog meter fixed only to a circuit board. A pointer connected to a shaft of the analog meter points a scale printed on a dial plate. A housing has a top plate and a peripheral wall perpendicularly extending from a periphery of the top plate. The dial plate is connected to the top plate without using screws. This arrangement improves the productivity and the luminance characteristic of the vehicular meter unit and suppresses the influence due to the thermal deformation of the dial plate.

26 Claims, 5 Drawing Sheets

VEHICULAR METER UNIT

BACKGROUND OF THE INVENTION

The present invention relates to a structure of a vehicular meter unit, and more particularly to an installation structure of the vehicular meter unit that improves its productivity and various performances.

Various vehicular meter units have been proposed and in practical use. FIG. 6 shows a conventional installation structure of a vehicular meter unit. As shown in FIG. 6, an analog meter unit 101 of the vehicular meter unit is constituted by a movement 101A, a shaft 101B, a pointer 101C and a dial plate 101D. A bottom surface of the movement 101A is fixed to a circuit board 102 by means of a plurality of installation screws 103A. A top surface opposite to the bottom surface of the movement 101A is fixed to a light guiding plate 104 laminated with the dial plate 101 D by means of screws 103B extending through holes 108. A protection cover 105 covers a bottom side of the movement 101A, and a front cover 106 covers the dial plate 101D and the pointer 101C. The light guiding plate 104 receives light from a lamp 107.

SUMMARY OF THE INVENTION

However, since this fixing structure is arranged to connect the movement with both the circuit board and the light guiding plate by means of screws, there are problems to be solved such that it requires a large number of the parts for the assembled unit and a lot of time for assembly operation steps thereof. Further, in case of a meter unit employing a continuous dial plate including a plurality of meters such as a speedometer (vehicle speed meter), a tachometer (engine rotation speed meter), a fuel gauge and a water temperature gauge, characters and scales thereof are printed on the continuous dial plate, and the movements of the respective meters are fixed to both the circuit board and the continuous dial plate. Further, the dial plate is generally made of polycarbonate having a larger thermal expansion characteristic and the circuit board is generally made of glass-epoxy or phenol resin having a small thermal expansion characteristic. Therefore, there is a possibility that the dial plate will be deformed with respect to the circuit board due to the thermal expansion characteristic of the dial plate larger than that of the circuit board. More particularly, under high temperature condition, the dial plate having a relatively small rigidity will be deformed with respect to the circuit board, or a shaft hole of the dial plate will be deformed so as to interfere the operation of the pointer shaft. Further, there is a possibility that the deformation of the dial plate will apply an undesired load to the movement so as to cause electrical troubles as to the movement. More specifically, the undesired load will be applied to a soldering portion of a connecting pin which electrically connects the movement and the circuit plate, so that the soldering portion may receive a stress to cause electrical contact-failure. Additionally, since the conventional meter unit has been arranged to be fixed to the dial plate laminated with the light guiding plate by means of screws, the screws will degrade the illuminating characteristic and the external appearance of the dial plate.

It is an object of the present invention to provide an improved vehicular meter unit which solves the above-mentioned problems while improving an installing easiness of a meter to a dial plate.

A vehicular meter unit according to the present invention is arranged such that an analog meter is not directly connected to a dial plate to avoid influence due to thermal deformation of the dial plate. That is, the vehicle meter unit according to the present invention is arranged to comprise a lower housing, a circuit board fixed to the lower housing and an analog meter fixed only to said circuit board.

More specifically, another aspect of the present invention resides in a vehicular meter unit which comprises a lower hosing, a circuit board, a dial plate and an analog meter. The lower housing includes a top plate and a peripheral wall perpendicularly extending from a periphery of the top plate. The circuit board is fixed to a free periphery of the lower housing peripheral wall. The dial plate is installed to the top plate of the lower housing. The analog meter is fixed only to the circuit board, a shaft of the analog meter penetrates the dial plate without contacting with the dial plate.

DETAILED DESCRIPTION OF THE INVENTION

Referring to FIGS. 1 to 5, there is shown an embodiment of a vehicular meter unit according to the present invention.

Figure 1:
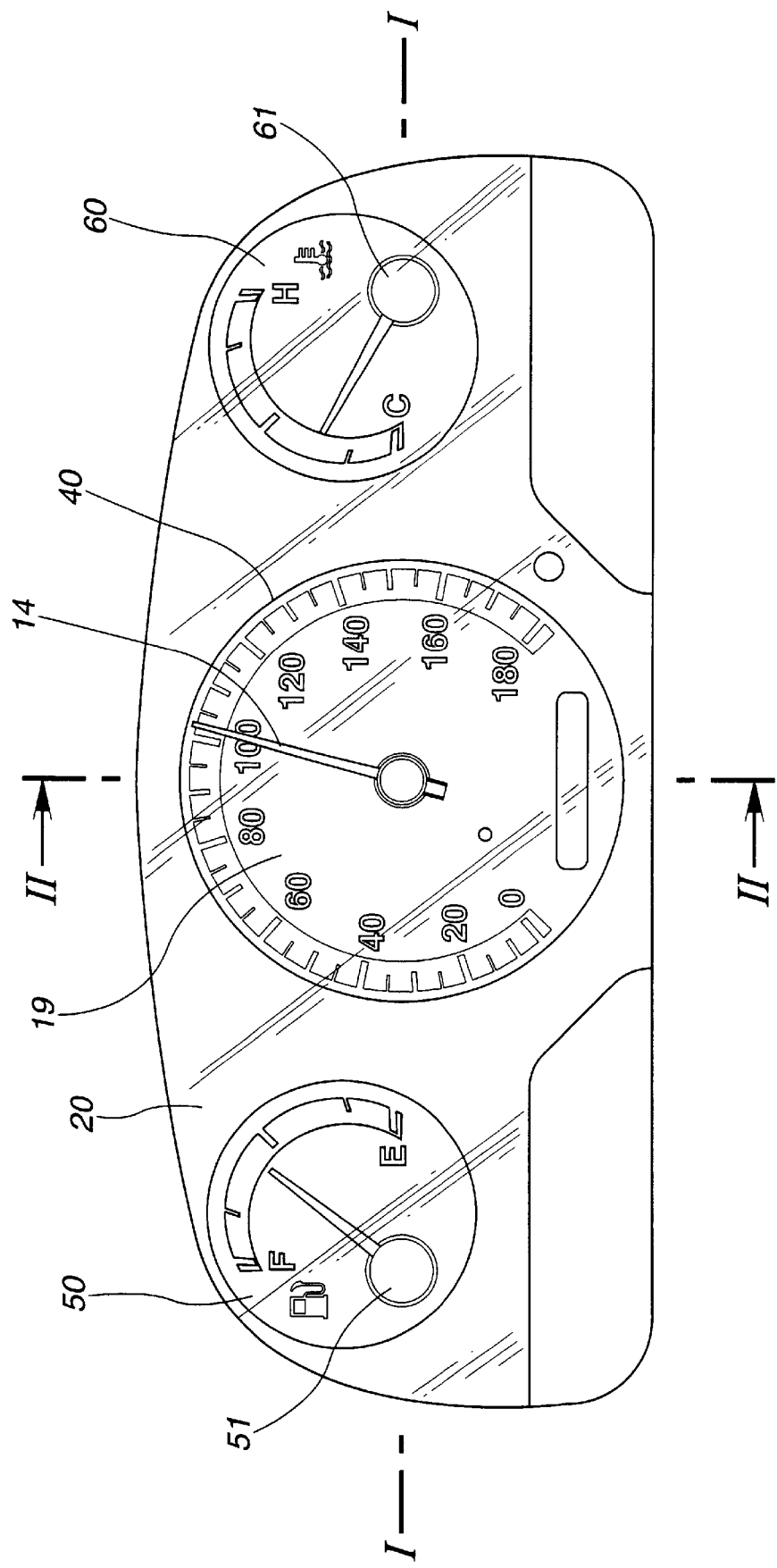
FIG. 1 is a front view of a vehicular meter unit of an embodiment according to the present invention.
Figure 2:
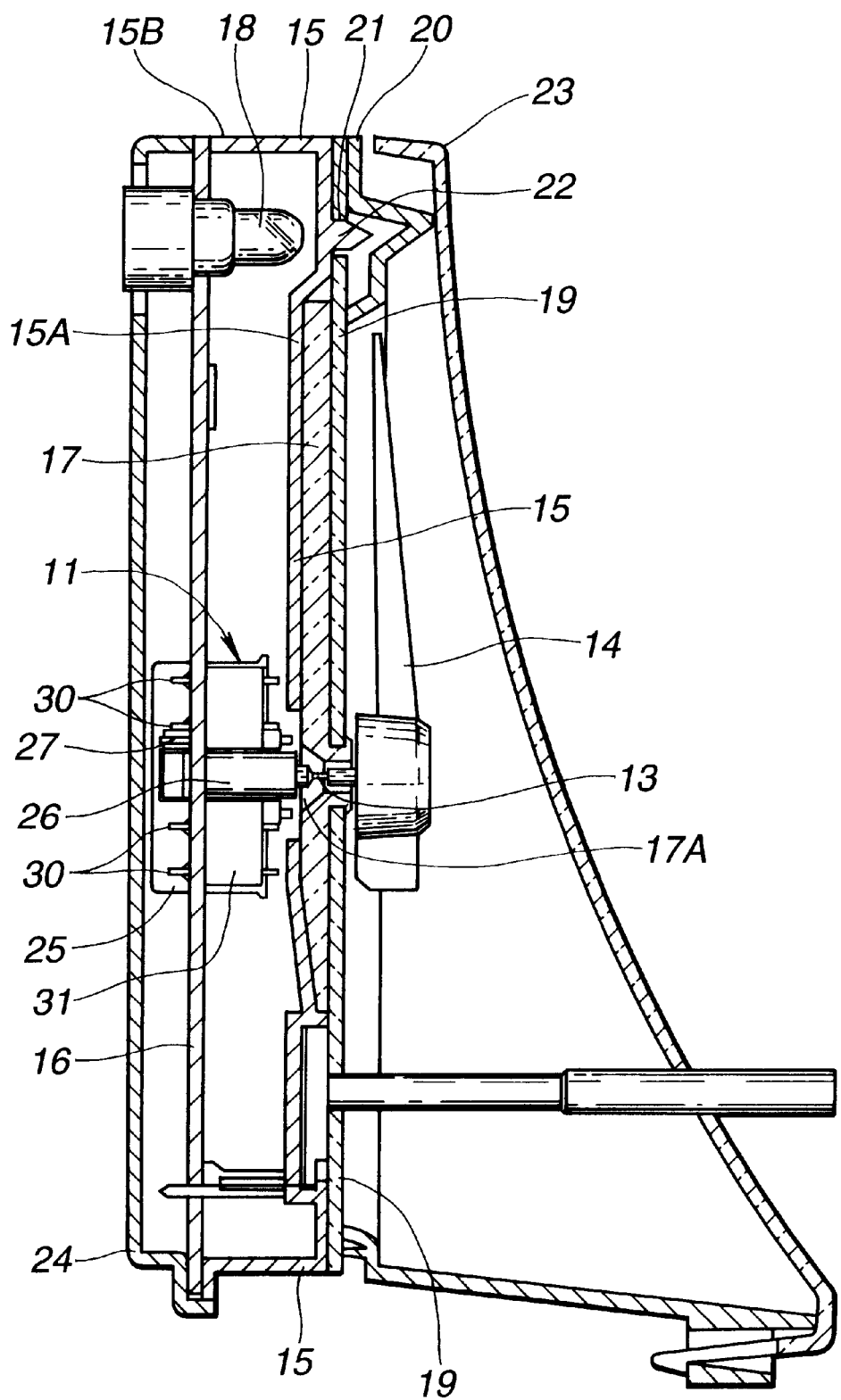
FIG. 2 is a cross-sectional view taken in the direction of the arrows substantially along line II—II of FIG. 1.

As shown in FIGS. 1 and 2, the meter unit comprises an analog type meter 11 which comprises a cross-coil type meter movement 12, a movement shaft 13 projecting from the meter movement 12 and a pointer 14 installed at a tip end of the movement shaft 13. The meter movement 12 includes a housing 31 in which a movable magnet (not shown) is rotatably received. Cross coils (no numeral) are wound around the housing 31 so as to cross around the housing 31. The meter movement 12 is received in a shield case 25 so as to be magnetically shielded from external magnetic field. The housing 31 is integrally formed with supporting portions which are located at external both sides of the shield case 25. A circuit board 16 having circuits for controlling the meter movement 12 is installed to a lower housing 15 so as to close a rear opening of the lower housing 15. More specifically, the lower housing 15 is constituted by a top plate 15A and a peripheral wall 15B perpendicularly extending from a periphery of the top plate 15A. A free peripheral end of the peripheral wall 15B defines the rear opening to which the circuit board 16 is fittingly installed. The meter movement 12 for a speedometer 40 is installed on the circuit board 16 through the shield case 25.

A light guiding plate 17, through which light of a lamp 18 illuminates a dial plate 19, is overlappedly set on an upper surface of the top plate 15A of the lower housing 15. The upper surface is a side facing to a driver of the vehicle. The lamp 18 is supported to and electrically connected to the circuit board 16. The light guiding plate 17 receives the light of the lamp 18 and emits light from its surface. Overlapped on the illuminating surface of the light guiding plate 17 is the dial plate 19 on which scales and characters of the speedometer 40, a fuel gauge 50 and a water temperature gauge 60 are printed. It will be understood that characters and scales for a tachometer may be printed thereon although it is not shown in this embodiment. As shown in FIG. 1, the speedometer 40, the fuel gauge 50 and the water temperature gauge 60 are straightly arranged such that centers of pointer holes of the respective meters 40, 50 and 60 are horizontally aligned on an imaginary horizontal line I. Further, a line connecting the center of a shaft hole of the fuel gauge 50 and an empty indicating point of a scale of the fuel gauge 50 is horizontal and coincident with the imaginary horizontal line I. Each of the fuel gauge 50 and the water temperature gauge 60 employs a movement similar to the meter movement 12 though the explanation thereof is omitted herein. Further, the movements of the fuel gauge 50 and the water temperature gauge 60 are fixed to the circuit board 16 in a manner as same as that of the meter movement 12 of the speedometer 40.

Figure 5:
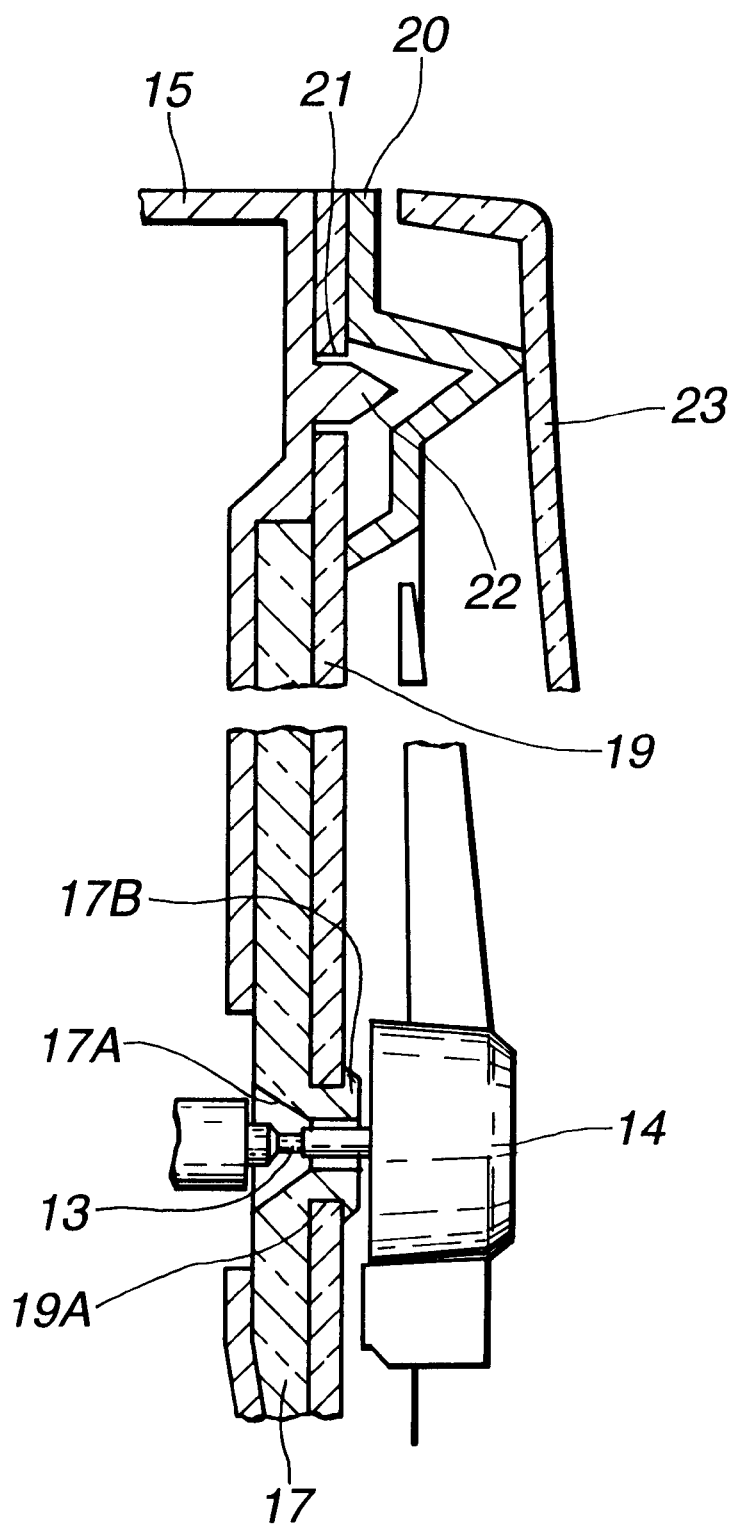
FIG. 5 is an enlarged cross-sectional view of an assembly of a dial plate and the meter movement including a pointer.
Figure 6:
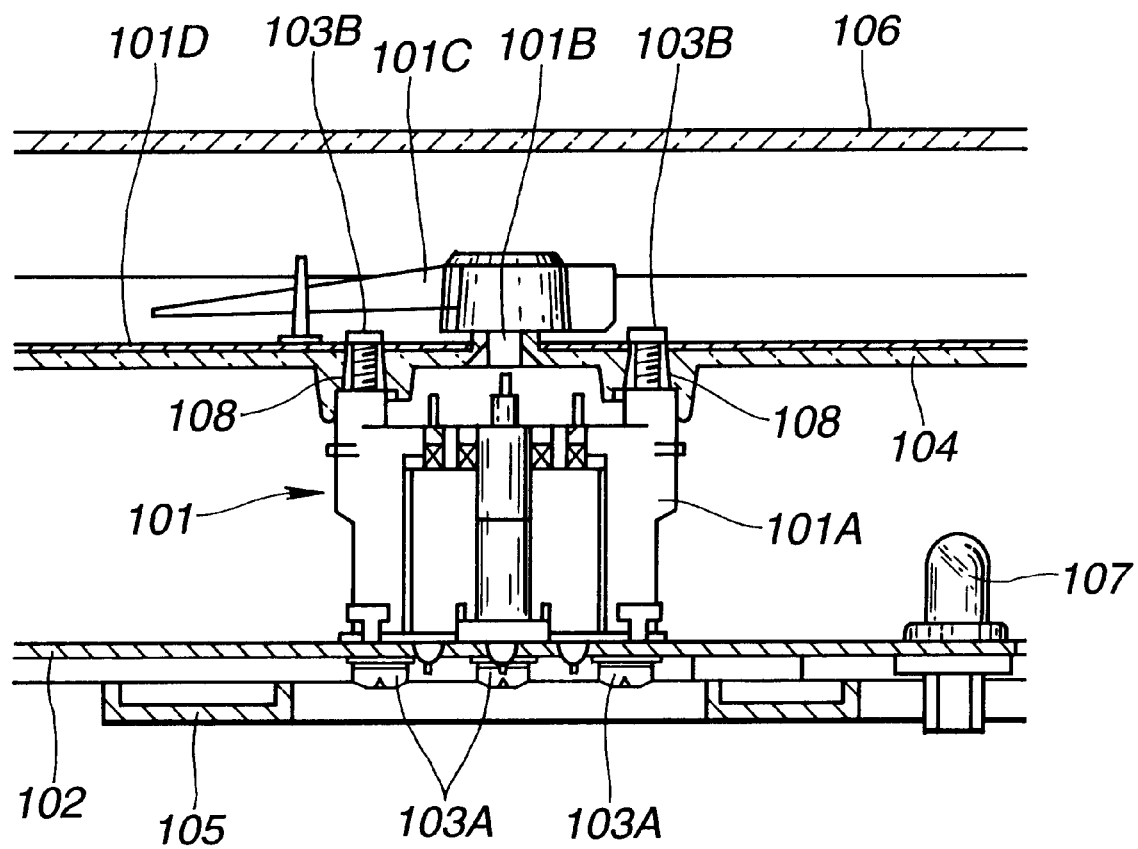
FIG. 6 is a cross-sectional view of a conventional meter unit.

As shown in FIG. 5, the dial plate 19 is sandwiched between the lower housing 15 and an upper housing 20 which is positioned so as to face with a front surface of the lower housing 15. A plurality of through holes 21 for positioning the dial plate 19 with respect to the lower housing 15 are provided at a peripheral portion of the dial plate 19. A plurality of projections 22 are provided near the peripheral portion of the lower housing 15 and are engaged with the through holes 21 of the dial plate 19 to fix the dial plate 19 on the lower housing 15. The light guiding plate 17 has a projecting portion 17B and a through hole 17A. The projecting portion 17B is engagingly inserted to a hole 19A of the dial plate 19. The through hole 17A is formed to pass through the projection portion 17B and has a cone-shaped portion and a straight portion as shown in FIG. 5. The movement shaft 13 projects from the meter movement 12 to the dial plate 19 through the through hole 17A. The through hole 17A is formed such that its diameter is sufficiently larger than the movement shaft 13 of the meter 11. Therefore, the movement shaft 13 is not in contact with the light guiding plate 17 even if the thermal expansion of the dial plate 19 and the light guiding plate 17 deform the through hole 17A. A front cover 23 made of transparent or semi-transparent material is installed on the upper housing 20 to cover the front surface of the upper housing 20. A rear cover 24 is installed at a rear portion of the circuit board 16 to cover the circuit board 16.

Figure 3:
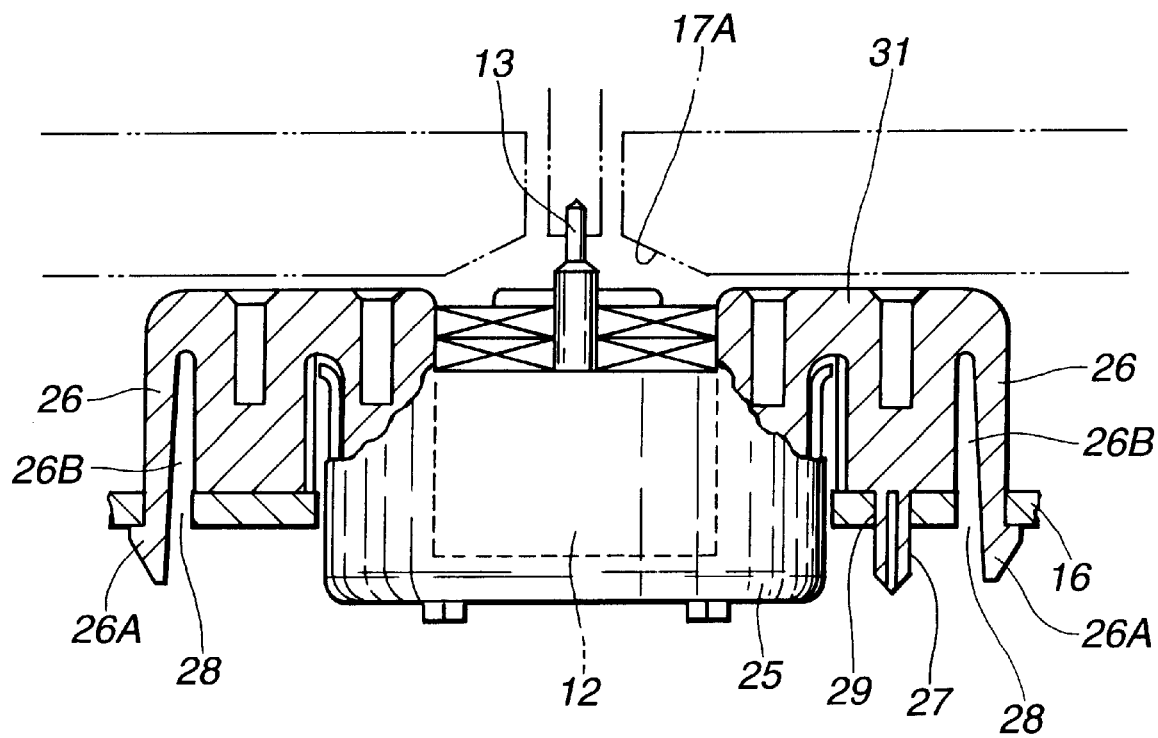
FIG. 3 is an enlarged side view showing a meter movement and a circuit board of the vehicular meter unit.
Figure 4:
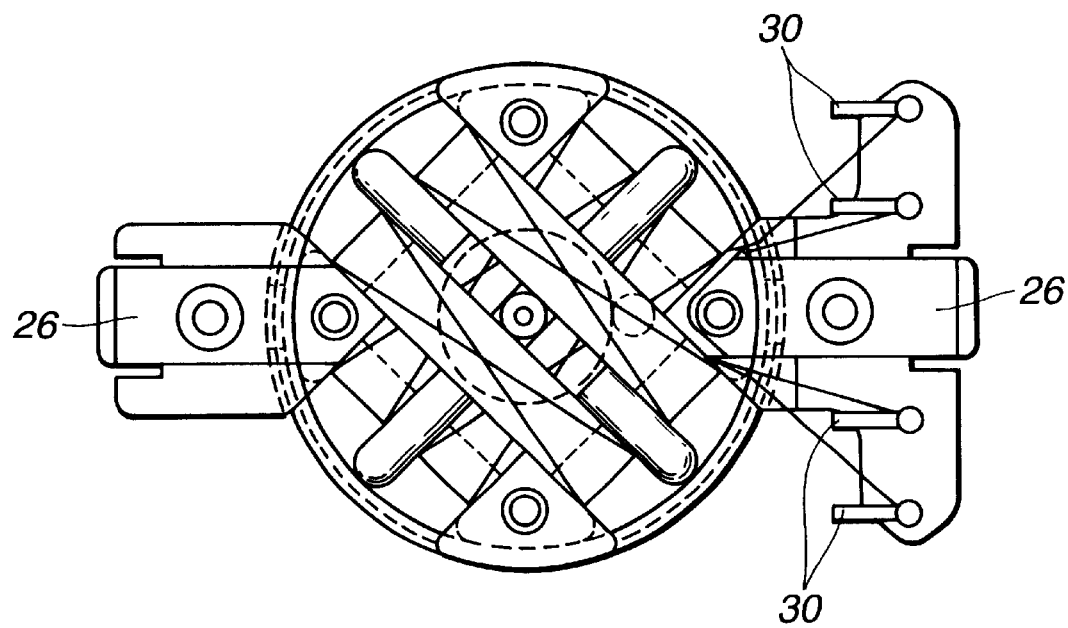
FIG. 4 is a plan view of the meter movement.

Next, the manner of installing operation of the meter movement 12 to the circuit board 16 will be discussed with reference to FIGS. 3 and 4.

The meter movement 12 is fixedly installed in the shield case 25 so that a pair of fixing hooks 26 and a locating pin 27 are located outside the shield case 25. The fixing hooks 26 are disposed at both sides of the meter movement 12, and the locating pin 27 is projectingly disposed at a rear surface of the supporting portion of the housing 31. The fixing hooks 26 and the locating pin 27 are integrally formed with the housing 31 of the meter movement 12.

The fixing hooks 26 are hooked to a pair of fixing holes 28 of the circuit board 16, and the locating pin 27 is fixedly inserted to a positioning hole 29 of the circuit board 16. As shown in FIG. 3, the fixing hooks 26 are configured to be resiliently deformable in a direction perpendicular to the axis of the meter movement 12 by the provision of slits 26B. Further, a hook portion 26A is provided at a tip end of each fixing hook 26 so as to be hooked on an edge defining the fixing hole 28. As shown in FIG. 4, four terminals 30 are installed to the housing 31 of the meter movement 12. The terminals 30 are electrically connected to terminals of coils of the meter movement 12.

Hereinafter, assembly process of the vehicular meter unit employing the above-mentioned parts will be discussed.

First, the meter movement 12 fixedly installed in the shield case 25 is fixed to the circuit board 15. More specifically, the fixing hooks 26 and the locating pin 27 of the meter movement 12 are engaged with the fixing holes 28 and the positioning hole 29 of the circuit board 16, respectively. The engagement between the fixing hooks 26 and the fixing holes 28 establishes the fixing of the meter movement 12 to the circuit board 16 in a thickness direction of the circuit board 16. Further, the fitted engagement between the locating pin 27 and the positioning hole 29 restricts a displacement between the meter movement 12 and the circuit board 16 in a lateral direction corresponding to the direction along the surface of the circuit board 16. The engagement between the meter movement 12 and the circuit board 16 is established by one step action.

Next, the terminals 30 of the meter movement 12 are electrically connected to an electrical circuit of the circuit board 16 by means of soldering.

Following to this, the lower housing 15 is connected to the circuit board 16 so as to cover the circuit board 16 assembled with the meter movement 12, and the light guiding plate 17 and the dial plate 19 are set on the front surface of the lower housing 15. When the light guiding plate 17 and the dial plate 19 are set on the lower housing 15, the fixing projection 22 of the lower housing 15 are inserted to the through holes 21 of the dial plate 19 so as to fix the dial plate 19 with respect to the lower housing 15 in the lateral direction corresponding to a direction along a plate surface of the dial plate 19. Further, the projection 17B of the light guiding plate 17 is simultaneously and fittingly inserted to the hole 19A of the dial plate 19.

Next, the upper housing 20 is set on the dial plate 19 and is fixedly connected to the lower housing 15 by means of installation screws and/or fixing hooks (not shown) so that the light guiding plate 17 and the dial plate 19 are sandwiched between the upper and lower housings 20 and 15. More particularly, the installation screws and/or fixing hooks connect the upper housing 20 and the lower housing 15 so as not to penetrate the light guiding plate 17 and the dial plate 19. The upper surface of the lower housing 15 and the lower surface of the upper housing 20 clump the light guiding plate 17 and the dial plate 19 as shown in FIG. 2.

The pointer 14 for pointing scale on the dial plate 19 is then installed to the movement shaft 13 of the meter movement 12. Further, the front cover 23 is set on the upper housing 20, and the rear cover 24 is set at a rear portion of the circuit board 16 to cover it. By these assembly steps, the vehicular instrument panel unit are provided.

The vehicular meter unit mentioned in the embodiment according to the present invention is arranged such that the dial plate 19 is installed to the lower housing 15 through the through holes 21 and the fixing projections 22 and is sandwiched and/or clamped by the lower housing 15 and the upper housing 20. Therefore, the dial plate 19 is arranged to be free from the circuit board 16, that is, not to be fixed to the circuit board. Accordingly, even if the circuit board 16 and the dial plate 19 are differently deformed by the difference of the thermal expansion coefficients therebetween, for example, even if the thermal expansion of the dial plate 19 is greater than that of the circuit board 16, the thermal expansion of the dial plate 19 is never prevented by the thermal expansion of the circuit board 16. That is, even if the dial plate 19 is made of material having a large thermal expansion characteristic, since the dial plate 19 is not in contact with the meter movement 12 fixed on the circuit board 16, the dial plate 19 never affects the meter movement 12. Further, since the dial plate 19 is fixed by means of the positioning between the through holes 21 and the fixing projections 22 and the sandwiching between the lower housing 15 and the upper housing 20 without using installation screws, it is possible to decrease the number of parts and the installation steps.

Further, since the meter 11 is fixed to the circuit board 16 by means of the connecting between the fixing hooks 26 and the fixing holes 28 and the positioning through the locating pin 27 and the positioning hole 29, the installation operation of the meter 11 to the circuit board 16 is largely improved. Additionally, this decreases the number of installation parts and the production cost.

Furthermore, since the light guiding plate 17 is fixed between the lower housing 15 and the dial plate 19 without using screws, the light guiding plate 17 ensures its high brightness performance. Furthermore, the dial plate 19 maintains its external appearance good.

By employing the assembly unit of the vehicular meter according to the present invention, the number of the assembled parts is decreased so as to decrease the steps for assembly operations. This also decreases the production cost of the vehicular meter unit. Further, since the dial plate 19 and the circuit board 16 are connected only through the lower housing 15, this structure functions to absorb the difference between thermal expansions of the dial plate 19 and the circuit board 16, only at their peripheral portions.

Since the speedometer 40 is arranged generally at a center portion of the dial plate 19, an indication error of the speedometer 40 caused by thermal deformation of the dial plate 19 is suppressed. More specifically, even if the dial plate 19 is deformed by the thermal expansion, the center portion of the dial plate 19 is equivalently deformed in the right and left hand directions. Therefore, the indicating error of the speedometer 40 set at the center portion of the dial plate 19 is kept small. Further, since the speedometer 40 is an essential meter to execute a vehicle drive, it is important to suppress an indicating error of the speedometer 40. Therefore, this arrangement according to the present invention effectively contributes to suppress the error of the speedometer 40.

Since the dial plate 19 has an elongated shape in a lateral or horizontal direction, the horizontal deformation amount of the dial plate 19 due to the thermal expansion is greater than a vertical deformation amount of the dial plate 19. Since the fuel gauge 50 is arranged such that an empty position has a high level as same as a center of a pointer 51 of the fuel gauge 50 as shown in FIG. 1, an indicating error in the vicinity of the empty position of the fuel gauge 50 is suppressed. In addition, the water temperature meter 60 has a pointer 61 in horizontal alignment with the pointer 51 of the fuel gauge 50, as shown in FIG. 1.

Although the explanation of the fuel meter 50 and the water temperature meter 60 shown in FIG. 1 has been almost facilitated herein, these meters 50 and 60 also employ movements and installation structures similar to those of the speedometer 40.

The entire contents of Japanese Patent Application No. 10-157030 filed on Jun. 5, 1998 in Japan are incorporated herein by reference.

Although the invention has been described above by reference to a certain embodiment of the invention, the invention is not limited to the embodiments described above. Modifications and variations of the embodiments described above will occur to those skilled in the art, in light of the above teaching.

What is claimed is:

1. A vehicular meter unit comprising:
   a lower housing;
   a circuit board fixed to said lower housing, said circuit board having fixing holes and positioning holes;
   a plurality of meter movements fixed only to said circuit board, said meter movements having pointer shafts, respectively, at least two of said meter movements capable of being moved independently of one another, each of said meter movements having fixing hooks which are engaged with the fixing holes of said circuit board and a locating pin which is inserted into the positioning hole of said circuit board; and
   a dial plate having a plurality of holes which the pointer shafts extend through and a plurality of scales for said meter movements, said dial plate being located apart from said circuit board.

2. A vehicular meter unit comprising:
   a lower housing;
   a circuit board fixed to said lower housing;
   a plurality of meter movements fixed only to said circuit board, said meter movements having pointer shafts, respectively; and
   a dial plate having a plurality of holes which the pointer shafts extend through and a plurality of scales for said meter movements, said dial plate being located apart from said circuit board, wherein each of said meter movements includes a locating pin which extends in a direction parallel with an axis of the meter movement and a plurality of fixing hooks which are resiliently deformed in a direction perpendicular to the axis of said meter movement, the locating pin being inserted to a positioning hole of said circuit board, the fixing hooks being hooked to fixing holes of said circuit board.

3. The vehicular meter unit as claimed in claim 1, further comprising:
   an upper housing fixed to said lower housing; and
   a light guiding plate; wherein said dial plate is overlappedly put on said light guiding plate and is sandwiched by said lower housing and said upper housing.

4. The vehicular meter unit as claimed in claim 1, wherein the vehicular meter unit includes a speedometer, a fuel gauge and a water temperature gauge.

5. The vehicular meter unit as claimed in claim 3, wherein said upper housing is fixed to said lower housing by means of a fixing means so that the fixing means does not penetrate said dial plate and a light guiding plate laminated with said dial plate.

6. The vehicular meter unit as claimed in claim 4, wherein said dial plate includes scales and characters for the speedometer, the fuel gauge and the water temperature gauge, axial centers of the speedometer, the fuel gauge and the water temperature gauge are aligned on a horizontal line.

7. The vehicular meter unit as claimed in claim 4, wherein said dial plate has an elongated shape in a horizontal direction when the vehicular meter unit is installed in a vehicle, the speedometer being arranged at a substantially center portion of said dial plate.

8. The vehicular meter unit as claimed in claim 6, wherein the fuel gauge is disposed at a side of said dial plate and arranged such that a line connecting an axial center of the fuel gauge and a point of a scale indicating an empty position is horizontal.

9. The vehicular meter unit as claimed in claim 6, wherein a line connecting the axial center of the fuel gauge and a point of a scale indicating an empty position is coincident with the horizontal line.

10. A vehicular meter unit comprising:
- a lower housing including a top plate and a peripheral wall perpendicularly extending from a periphery of the top plate:
- a circuit board fixed to the peripheral wall of said lower housing, said circuit board having fixing holes and positioning holes;
- a plurality of analog meter movements fixed only to said circuit board, each of said analog meter movements having a pointer shaft, at least two of said meter movements capable of being moved independently of one another, each of said meter movements having fixing hooks which are engaged with the fixing holes of said circuit board and a locating pin which is inserted into the positioning hole of said circuit board;
- a dial plate installed to the top plate of said lower housing, said dial plate being located apart from said circuit board, said dial plate having a plurality of scales for said meter movements and a plurality of holes through which the pointer shafts of said meter movements penetrate said dial plate; and
- a plurality of pointers fixedly connected to tip ends of the pointer shafts of said analog meter movements, respectively, said pointers pointing along the scales, respectively.

11. The vehicular meter unit as claimed in claim 10, further comprising an upper housing connected to said lower housing, said dial plate being sandwiched between said lower housing and said upper housing.

12. The vehicular meter unit as claimed in claim 10, further comprising a light guiding plate overlapped with said dial plate so as to illuminate said dial plate by means of light of a lamp, said light guiding plate having a projection connected to a hole of said dial plate and a through hole formed at the projection, the pointer shaft penetrating said dial plate and said light guiding plate through the through hole.

13. A vehicular meter unit comprising:
- a lower housing including a top plate and a peripheral wall perpendicularly extending from a periphery of the top plate;
- a circuit board fixed to the peripheral wall of said lower housing, said circuit board having fixing holes and positioning holes;
- a dial plate installed to the top plate of said lower housing, characters and scale being printed on a surface of said dial plate, said dial plate having a plurality of pointer holes;
- a plurality of movements fixed to said circuit board, at least two of said movements capable of being moved independently of one another, each of said movements having fixing hooks which are engaged with the fixing holes of said circuit board and a locating pin which is inserted into the positioning hole of said circuit board;
- a plurality of meter shafts extending from said movements to said dial plate without being in contact with said dial plate, respectively, said meter shafts penetrating said dial plate through the pointer holes; and
- a plurality of pointers fixed to a tip end of the meter shafts, respectively, said pointer variably pointing along the scale.

14. The vehicular meter unit as claimed in claim 1, further comprising an upper housing connected to said lower housing, said dial plate being sandwiched between said lower housing and said upper housing.

15. The vehicular meter unit as claimed in claim 1, wherein said dial plate is formed of a continuous plate.

16. The vehicular meter unit as claimed in claim 1, wherein said meter movements are analog meter movements.

17. A method for assembling a vehicular meter unit, comprising the steps of:
- fixing a plurality of meter movements to a circuit board by engaging fixing hooks of each meter movement to fixing holes of the circuit board and by inserting a locating pin of each meter movement into a positioning hole of the circuit board, at least two of said meter movements capable of being moved independently of one another;
- connecting the circuit board to a lower housing;
- positioning a dial plate and a light guiding plate on the front of said lower housing;
- attaching an upper housing to said lower housing by fasteners that do not penetrate said light guiding plate and said dial plate, such that said light guiding plate and said dial plate are positioned between said lower housing and said upper housing; and
- installing a plurality of pointers on the dial plate and connecting them to their respective meter movement.

18. A vehicular meter unit comprising:
- a lower housing;
- a circuit board fixed to said lower housing, said circuit board having fixing holes and positioning holes;
- a plurality of meter movements fixed only to said circuit board, said meter movements having pointer shafts, respectively, at least two of said meter movements capable of being moved independently of one another, each of said meter movements having fixing hooks which are engaged with the fixing holes of said circuit board and a locating pin which is inserted into the positioning hole of said circuit board; and
- a dial plate having a plurality of holes which the pointer shafts extend through and a plurality of scales for said meter movements, said dial plate being located apart from said circuit board, a diameter of each hole of said dial plate being greater than a diameter of each pointer shaft corresponding to each hole.

19. The vehicular meter unit as claimed in claim 18, wherein axes of said meter movements are aligned on a horizontal line.

20. The vehicular meter unit as claimed in claim 18, wherein the vehicle meter unit comprises at least a speedometer and a fuel gauge.

21. The vehicular meter unit as claimed in claim 20, wherein the fuel gauge is located at a laterally side portion of said dial plate, and a line connecting an axis of the fuel gauge and a scale indicating an empty of fuel coincident with the horizontal line.

22. The vehicular meter unit as claimed in claim 1, wherein said circuit board controls movement of said meter movements.

23. The vehicular meter unit as claimed in claim 10, wherein said circuit board controls movement of said meter movements.

24. The vehicular meter unit as claimed in claim 13, wherein said circuit board controls movement of said movements.

25. The method of assembling a vehicular meter unit as claimed in claim 17, wherein said circuit board controls movement of said meter movements.

26. The vehicular meter unit as claimed in claim 18, wherein said circuit board controls movement of said meter movements.

* * * * *